United States Patent [19]

Matsudo

[11] Patent Number: 5,049,784
[45] Date of Patent: Sep. 17, 1991

[54] ELECTRON GENERATING APPARATUS

[75] Inventor: Masahiko Matsudo, Kofu, Japan

[73] Assignee: Tokyo Electron Limited, Tokyo, Japan

[21] Appl. No.: 527,946

[22] Filed: May 24, 1990

[30] Foreign Application Priority Data

May 25, 1989 [JP] Japan .................................. 1-132084

[51] Int. Cl.$^5$ ............................................ H01J 27/02
[52] U.S. Cl. .......................... 315/111.81; 315/111.21; 313/231.31; 250/423 R; 250/427
[58] Field of Search ...................... 315/111.21, 111.31, 315/111.41, 111.81; 313/231.31; 250/423 R, 427, 492.3

[56] References Cited

U.S. PATENT DOCUMENTS 3,178,604 4/1965 Eklund .................................. 313/147
3,448,315 6/1969 Hirsch et al. ......................... 313/63
3,924,134 12/1975 Uman et al. ..................... 250/423 R
4,691,109 9/1987 Magee et al. ............. 315/111.81 X
4,841,197 6/1989 Takayama et al. ........ 315/111.41 X

FOREIGN PATENT DOCUMENTS 2146836 4/1985 United Kingdom .

OTHER PUBLICATIONS

Proc. Int'l Ion Engineering Congress-ISIAT '83 & IPAT '83, Kyoto, 1983, pp. 407–410, O. Tabata et al., "Characteristic of a Freeman Ion Source with an AC Filament".

Primary Examiner—Eugene R. LaRoche
Assistant Examiner—Do Hyun Yoo
Attorney, Agent, or Firm—Oblon, Spivak, McClelland, Maier & Neustadt

[57] ABSTRACT

An electron generating apparatus for an ion source for example, which is capable of prolonging service life and facilitating the exchange of its filament has been proposed. The electron generating apparatus includes an electron generating chamber having a discharging gas supply hole and electron extracting hole, a pair of conductive filament support members mounted in the chamber through an insulating plate, and a filament detachably fixed on the filament support members. At least one of the filament support members is provided with an overhang to cover at least part of a region between the lower ends of the filament.

10 Claims, 2 Drawing Sheets

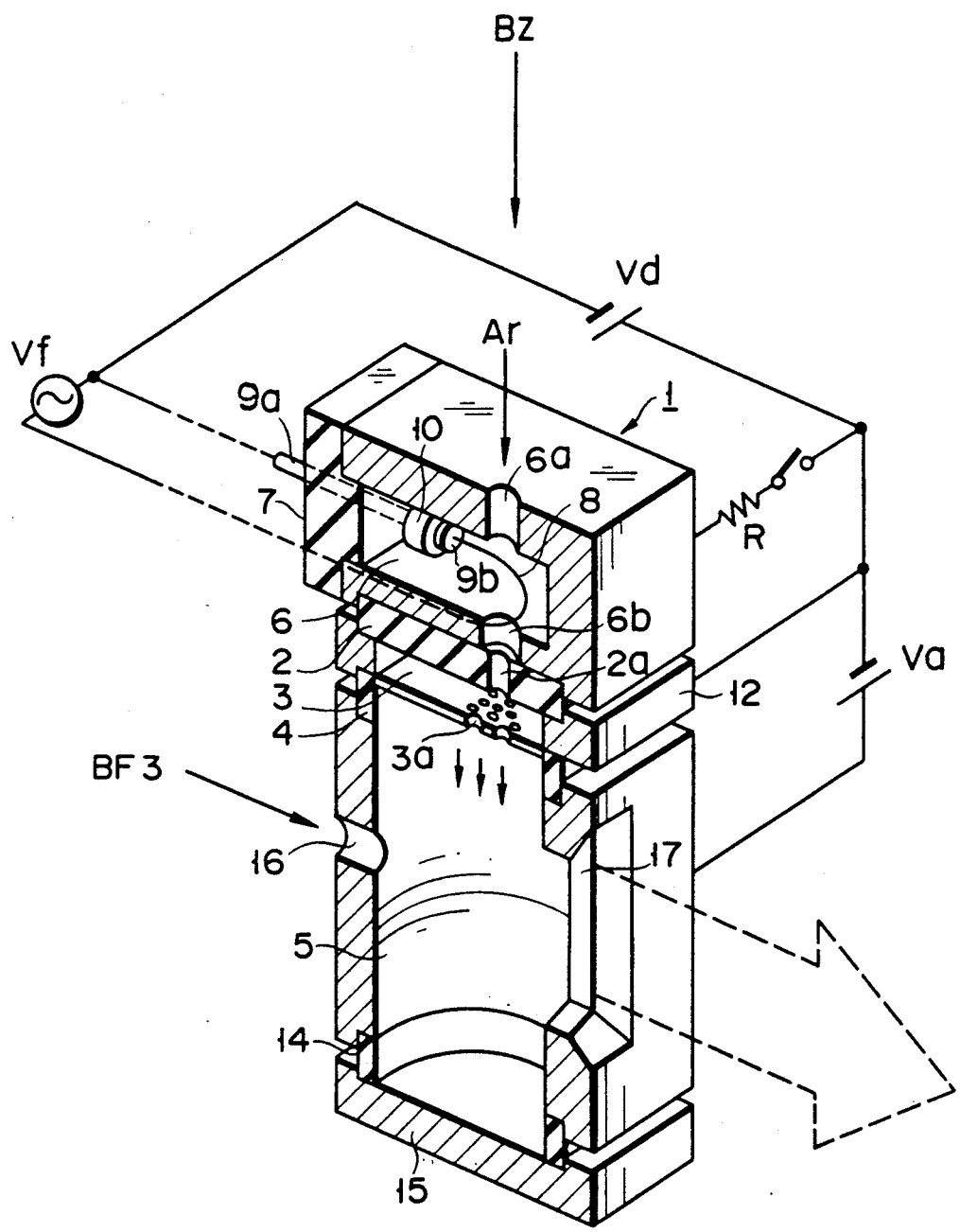
F I G. 1

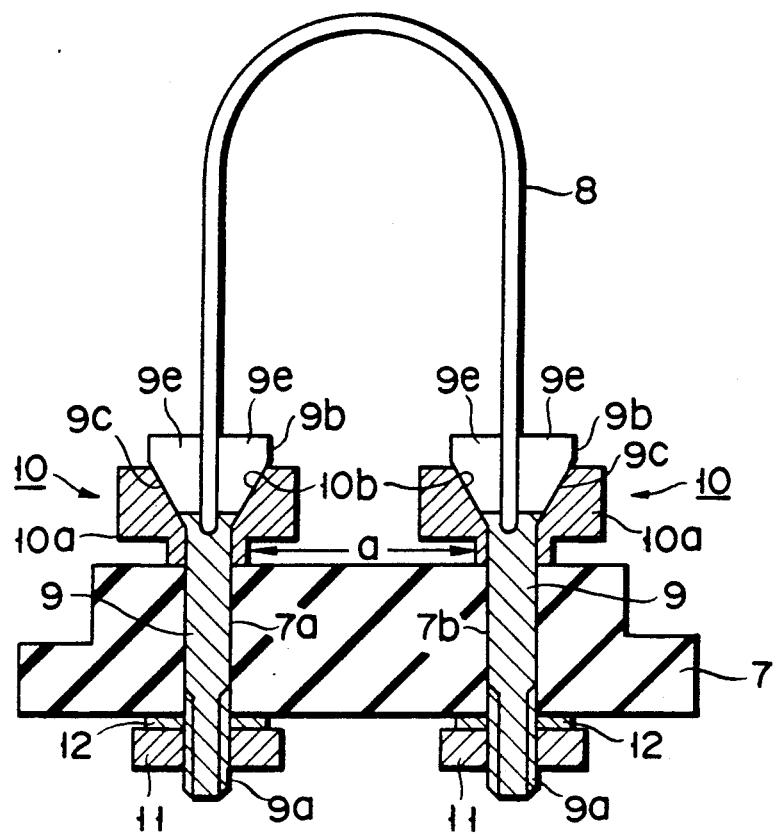
F I G. 2
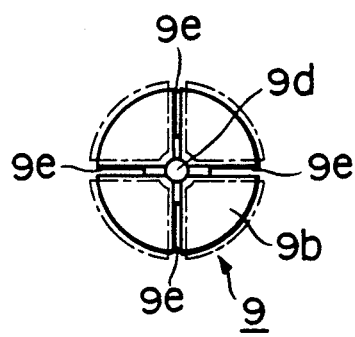
F I G. 3

ELECTRON GENERATING APPARATUS

BACKGROUND OF THE INVENTION

1. Field of the Invention

The present invention relates to an electron generating apparatus to be used for example in an ion source such as an electron beam excitation ion source.

2. Description of the Related Art

An ion source is generally used in an ion implantation apparatus for implanting ions as an impurity in, e.g., a semiconductor wafer and widely used in an apparatus for treating a surface of a semiconductor wafer or analyzing a solid body.

Conventional ion sources, e.g., a Freeman type ion source as follows, are widely used. A power is applied between a filament (cathode) and an anode electrode to generate a plasma from a predetermined gas, and desired ions are extracted from the plasma and used.

There is proposed in Published Unexamined Japanese Patent Application No. 62-278736 an electron beam excitation ion sources having a different construction from the above-mentioned Freeman type ion sources. A power is applied between a filament and an anode electrode to generate a first plasma from a predetermined gas, and electrons are extracted from the first plasma to be radiated onto a predetermined gas, thereby generating a second plasma. Desired ions are extracted from the second plasma and used.

According to the electron beam excitation ion source, a high ion current density can be obtained with a low ion energy, and the frequency of maintenance can be reduced to achieve high-efficiency processing due to long service life.

However, according to the ion source, the following problems are posed. The filament is sputtered at a unit (electron generating unit) for generating the first plasma by ions in the plasma, and the service life and maintenance of the electron generating unit are variously influenced.

For this reason, a countermeasure against the maintenance problems has been conventionally taken, e.g., only a filament body which is easily worn out by sputtering is arranged to be exchangeable. However, this countermeasure is not satisfactory.

SUMMARY OF THE INVENTION

The present inventors examined the service life of an electron generating unit and various maintenance problems, and found the following facts.

That is, it was found that, in un ion source wherein a power was applied between a filament and an anode electrode to generate a predetermined plasma, the filament was sputtered by ions in the plasma, and the sputtered ions were attached in a region between support portions for supporting both ends of the filament, thereby electrically short-circuiting these portions.

In addition, the following fact could be found. At the time of generation of a plasma from a discharged gas, the main cause for determining wear of a filament is sputtering induced by an electric potential between the filament and plasma. When the filament is energized and heated by a DC current as in a conventional method, since the electric potential is always generated, the electric potential generated between the plasma and the filament has always a nonuniform distribution along the longitudinal direction of the filament. For this reason, the filament is nonuniformly worn along its longitudinal direction, and the negative side of the filament is locally remarkably worn thereby largely shortening the service life of the filament.

It was found that a conventional mechanism for detachably holding a filament body was structurally complicated and had poor exchange workability, and filament exchange had a large loss time.

The present invention has been made on the basis of the above findings, and has as its object to provide an ion source electron generating apparatus capable of prolonging service life compared with a conventional apparatus and improving processing efficiency by decreasing frequency of maintenance and facilitating the maintenance.

In order to achieve the above object, according to the present invention, a shade for preventing attachment of a sputtered product produced by a filament is arranged on at least part of a range between two leg portions of a substantially U-shaped filament arranged in an electron generating chamber of an ion source electron generating apparatus, and electric short-circuiting between both the leg portions of the filament is prevented, thereby prolonging service life of the apparatus and improving safety of the apparatus.

According to the present invention, in order to achieve the above object, a filament is supplied with an AC current and heated, and local wear of the filament by sputtering is prevented as much as possible, thereby prolonging service life of the filament.

According to the present invention, in order to achieve the above object, a filament body is detachable by a clamping method, thereby facilitating an exchange operation of filaments.

According to the present invention, there is provided an electron generating apparatus comprising a chamber made of a conductive refractory material and having a discharging gas supply hole and an electron extracting hole, an insulating plate fixed on a side of the chamber, a pair of conductive filament support members inserted in the chamber through the insulating plate, a filament, both leg portions of which are fixed on the filament support members, housed in the chamber, an overhang extending from at least one insertion portion of the filament support member to the other insertion portion of the filament support member to cover at least part of a region between the ends of the filament.

According to the present invention, there is provided a electron generating apparatus wherein an AC current power source is connected to the conductive filament supporting member in order to supply an AC current to the filament.

According to the present invention, there is provided an electron generating apparatus wherein the conductive filament support member comprises conductive rods, each distal end portion of which has an inverted conical shape to form a tapered surface, a filament insertion hole at the center of the rod, and a plurality of slits radially extending from the filament insertion hole to the tapered surface, and each proximal end portion of which has a threaded portion, the rods extending through an insulating plate, filament clamp portions each having an overhang at a head thereof and a tapered hole corresponding to the tapered surface of the rod, the filament support clamp portions respectively receiving the distal end portions of the rods on the insulating plate, and nuts threadedly engaged with the threaded portions of the proximal end portions of the rods, respectively, so that a diameter of the filament insertion hole is reduced upon fastening of a corresponding one of the nuts, thereby fixing both the leg portions of the filament.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention and, together with the general description given above and the detailed description of the preferred embodiment given below, serve to explain the principles of the invention.

FIG. 1 is a sectional view showing an electron beam excitation ion source according to an embodiment of the present invention;

FIG. 2 is a sectional view showing a filament mounting portion of the ion source in FIG. 1; and FIG. 3 is a plan view of only a filament support portion when viewed from the top.

DETAILED DESCRIPTION OF THE PREFERRED EMBODIMENT

An embodiment wherein the present invention is employed to an electron beam excitation ion source will be described below with reference to the accompanying drawings.

FIG. 1 is a sectional view showing a state wherein an electron beam excitation ion source is longitudinally cut into half. This ion source is mainly constituted by an electron generation apparatus 1, an apertured electron 3 (electrode extracting electrode) arranged under the electron generating apparatus 1 through an insulating member 2, and an ion generating chamber 5 arranged under the apertured electrode 3 through an insulating member 4.

More specifically, the electron generating apparatus 1 comprises a chamber 6 which is made of a conductive refractory material such as molybdenum and formed in a rectangular box-like shape having each side of, e.g., several centimeters and an opening on one side surface thereof, an insulating plate 7 detachably fixed on the chamber 6 to tightly cover the opening surface of the chamber 6, and a filament 8 arranged into the chamber 6 through the insulating plate 7.

Referring to FIGS. 2 and 3, this embodiment will be described in more detail. The insulating plate 7 is made of an insulator such as silicon nitride or boron nitride, and a pair of through holes 7a and 7b passing through the insulating plate 7 in a direction of thickness are formed in the insulating plate 7 and are spaced apart from each other. A filament support mechanism having the following structure is arranged in the through holes 7a and 7b.

The filament support mechanism is made of, e.g., a conductive refractory material such as tantalum and constituted by a pair of rods 9 arranged in the through holes 7a and 7b to pass through the insulating plate 7, filament clamps 10 arranged on the inner surface of the insulating plate 7 to be received by the top portions of the rods 9, and nuts 11 threadably engaged with threaded portions 9a of the proximal end portions of the rods 9.

More specifically, each of the rods 9, a proximal end portion (head portion) 9b of which is formed in an inverted conical shape, has a tapered surface 9c on the peripheral surface thereof, a filament insertion hole 9d at the center of the rod, and for example four slits 9e radially extending from the filament insertion hole 9d to the tapered surface 9c at equal angular intervals.

Each filament clamp 10 has a disk-like overhang 10a at the head portion thereof and a tapered hole 10b corresponding to the tapered surface 9c of the rod 9 at the center of the filament clamp 10. A filament clamp 10 is arranged on the inner surface of the insulating plate 7 while receiving the head portion of the rod 9.

Note that reference numeral 12 in FIG. 2 denotes a washer provided as needed.

The filament 8 is made of a refractory material such as a tungsten wire and formed in, e.g., a U-shape as shown in FIG. 2, and the ends of both the leg portions of the filament are inserted in the filament insertion holes 9d. The shape of the filament 8 may be of any shape, such as a V-shape or a spiral shape.

Note that the overhang 10a formed on the top portion of the filament clamp 10 is not limited to the disk-like shape as described above. The overhang has any shape when the overhang extends to cover at least part of a region "a" between both the leg portions of the filament 8. The overhang 10a may be provided to only one of the head portion of the filament clamp 10.

The overhang 10a is provided to only the head portion of one filament clamp 10.

The proximal end of the rod 9 is connected to a DC power source (preferably an AC power source), and a predetermined voltage can be applied to the filament.

A method of using the filament support mechanism will be described below. When the filament 8 is worn out by sputtering, the insulating plate 7 is detached from the electron generating apparatus 1 as shown in FIG. 1, and the nuts 11 are loosened. At this time, the head portions 9b of the rods 9 are released from the filament clamps 10, and as indicated by broken lines in FIG. 3, the widths of the slits 9e are increased, so that the filament can be removed. Thus, the filament 8 is removed from the filament clamps 10. Both the leg portions of a new filament 8 are inserted in the filament insertion holes 9d, and each of the nuts 11 is fastened to decrease the widths of the slits 9e so as to fix the filament 8. The insulating plate 7 is fixed in the opening of the chamber 6 again.

Note that, in this embodiment, the filament support mechanism having the four slits 9e is described above. The number of slits is not limited to four, and two or more slits can be arbitrarily selected.

As described above, the filament 8 can be easily exchanged with a new one in a short time, and downtime required for the exchange operation of the filament 8 can be reduced, thereby improving processing efficiency. In addition, since the filament 8 can be accurately fixed at a predetermined position, reproductivity and reliability can be improved.

A discharging gas supply hole 6a for supplying a discharging gas such as an argon (Ar) gas for generating a plasma and electrons is formed in the upper portion of the chamber 6, and a circular hole 6b having a diameter of, e.g., 3 mm for extracting electrons from a plasma generated in the chamber 6 is formed in the bottom of the chamber 6.

An insulating member 2 made of, e.g., silicon nitride or boron nitride is formed under the chamber 6 to form a narrow path 2a communicating with the circular hole 6b, and an electron extracting port is formed by the circular hole 6b and narrow path 2a.

An apertured electrode 3 made of a refractory material such as tungsten is arranged under the insulating member 2 through a spacer block 12. A large number of through holes 3a are formed in the apertured electrode 3 to oppose the narrow path 2a of the insulating member 2.

An ion generating chamber 5 is connected to the lower portion of the apertured electrode 3 through an insulating member 4 made of, e.g., silicon nitride or boron nitride. The ion generating chamber 5 is made of a conductive refractory material such as molybdenum and formed in a box like shape, and the inside of the chamber 5 has a cylindrical shape having a diameter of several centimeters and a height of several centimeters. A bottom plate 15 made of, e.g., a refractory material is fixed on the bottom portion of the ion generating chamber 5 through an insulating member 14 while the bottom plate 15 is electrically insulated from the side wall of the ion generating chamber 5 (floating state). The bottom plate 15 is charged upon radiation of electrons to reflect electrons. Note that the bottom plate 15 can be made of, e.g., an insulating member to form an electron reflection surface.

A source gas supply port 16 for supplying to the ion generating chamber 5 a source gas such as a BF$_3$ gas for generating predetermined ions is formed on the side surface of the ion generating chamber 5, and an ion extracting slit 17 is formed in the side surface of the ion generating chamber 5 to oppose the source gas supply port 16.

Note that the discharging gas supply hole 6a and the electron extracting port (6b, 2a) are formed eccentrically from the center of the chamber 6 to the ion extraction slit 17 side to efficiently extract ions. The filament 8 is arranged not to be positioned on a line between the discharging gas supply hole 6a and the electron extracting port (6b, 2a). Since ions supplied from the electron extracting port (6b, 2a) are difficult to reach the filament 8, sputtering and wear of the filament 8 caused by the reversed ions can be restrained.

In the electron beam excitation ion source with the above arrangement according to this embodiment, predetermined ions are produced by a magnetic field generating means (not shown) under a condition wherein a magnetic field for guiding electrons in the vertical direction as indicated by arrows Bz shown in FIG. 1 is applied.

That is, the magnetic field for guiding electrons in the vertical direction as indicated by arrows Bz shown in FIG. 1 is applied by the magnetic field generating means. An AC voltage Vf is applied to the filament 8 to energize and heat the filament, and a discharge voltage Vd is applied to the chamber 6 through a resistor R. A discharge voltage Vd is applied to the apertured electrode 3, and an acceleration voltage Va is applied between the apertured electrode 3 and ion generating chamber 5.

A discharging gas such as an argon gas is supplied to the electron generating chamber 6 from the discharging gas supply port 6a at a predetermined flow rate of, e.g., 0.05 SCCM or more, and a discharge is caused by the discharge voltage Vd to generate a plasma. At this time, electrons in the plasma pass trough the through holes 3a of the apertured electrode 3 and are extracted into the ion generating chamber 5.

Note that, at this time, the ions in the plasma collide with the filament 8 having a negative potential to sputter the filament 8 so as to attach the sputtered product to various portions. However, in this embodiment, since the overhang 10a is formed on the top of the filament clamp 10 thereby forming a shade area thereunder, the sputtered product is not attached to the surface region of the insulating plate 7. Therefore, both the leg portions of the filament 8 can be prevented from electric short-circuiting.

A predetermined source gas such as BF$_3$ is supplied from the source gas supply port 16 to the ion generating chamber 5 in advance, and a source gas atmosphere at a predetermined pressure of, e.g., 0.001 to 0.02 Torr is formed in the ion generating chamber 5.

Therefore, electrons supplied to the ion generating chamber 5 ar accelerated by an accelerating electric field and collide with the BF$_3$ gas to generate a high-concentration plasma. Ions are extracted from the plasma by the ion extracting slit 17, and the extracted ions are used as, e.g., a predetermined ion beam used in ion implantation for a semiconductor wafer.

According to this embodiment, since the overhangs 10a are formed around the leg portions of the filament 8 to mask at least part between both the leg portions of the filament 8 from the sputtered product of the filament, the ends of the filament 8 can be prevented from electric short-circuiting. For this reason, service life of the ion source electron generating apparatus can be prolonged, and safety thereof can be improved.

In addition, in the described embodiment, when the filament 8 is energized and heated by an AC current, since electric potentials are alternately changed by the frequency of the current, a plasma is moved to uniformly sputter the filament.

For this reason, service life of the filament 8 can be prolonged compared with a case wherein the filament 8 is energized and heated by a DC voltage, and the frequency of maintenance can be decreased, thereby improving productivity.

Note that the frequency of the AC voltage may fall within the range of, e.g., 50 to 60 Hz, but may be those outside this range.

In addition, since a plasma density is uniformed in the electron generating chamber 6 in which the filament 8 is housed, the diameter of the narrow path 2a can be decreased. When the diameter of the narrow path 2a is reduced, a pressure in the electron generating chamber 6 is increased. Even if a flow rate of the discharging gas is decreased, the plasma is kept generated. When the flow rate of the discharging gas is decreased, the amount of discharging gas supplied to the ion generating chamber 5, which does not contribute to a discharge, can be decreased. Therefore, a probability that electrons collide with the discharging gas molecules to be consumed can be reduced, and electrons efficiently collide with the source gas molecules to obtain, e.g., multivalent ions.

When electrons are focused in the narrow path 2a by decreasing the diameter of the narrow path 2a, the electrons easily pass through the narrow path 2a. A transmittance (Ia/Id) of electrons passing through the through hole 3a of the apertured electrode 3 is increased. An increase in transmittance must be set to obtain the transmittance of about 20% by increasing the length of the narrow path 2a so as to increase the denominator Id of the transmittance of electrons. Therefore, the service life of the narrow path can be prolonged by increasing the length of the narrow path $2a$.

As described above, although the plasma in the electron generating chamber 6 is moved by an AC electric field, the plasma in the ion generating chamber 5 is hardly influenced by the AC electric field. Therefore, uniformity of the extracted ions is rot degraded.

Note that, in the above embodiment, a case wherein the present invention is employed to an electron beam excitation ion source is described. However, the present invention is not limited to the above embodiment. The present invention can be applied to any ion source and other apparatus using a filament such as an X-ray source.

Additional advantages and modifications will readily occur to those skilled in the art. Therefore, the invention in its broader aspects is not limited to the specific details and representative device, shown and described. Accordingly, various modifications may be made without departing from the spirit or scope of the general inventive concept as defined by the appended claims and their equivalents.

What is claimed is:

1. An electron generating apparatus, comprising:
   a chamber made of a conductive refractory material and having a discharging gas supply hole and an electron extracting hole;
   an insulating plate fixed on a side of said chamber;
   a pair of conductive filament support members inserted in said chamber through said insulating plate;
   a filament, both leg portions of which are fixed on said filament support members, housed in said chamber; and
   an overhang radially extending from an upper portion of at least one of said filament support members, thereby forming a shade area on the surface of said insulating plate around a base portion of said filament support member, and substantially preventing a sputtered product of said filament from attaching to said shade area.

2. An apparatus according to claim 1, wherein an AC power source for supplying an AC current to said filament is connected to said conductive filament support members.

3. An apparatus according to claim 1, wherein said overhang radially extends from the leg portion of said filament.

4. An apparatus according to claim 1, wherein said filament is detachably fixed on said conductive filament support members.

5. An apparatus according to claim 1, wherein said conductive filament support members comprise conductive rods, each distal end portion of said rods having an inverted conical shape to form a tapered surface, a filament insertion hole at the center of said rod, and a plurality of slits radially extending from said filament insertion hole to said tapered surface, and each proximal end portion of said rods has a threaded portion, said rods extending through said insulating plate, filament clamp portions each having the overhang at a head thereof and a tapered hole corresponding to said tapered surface of said rod, said filament clamp portions respectively receiving the each distal end portion of said rods on said insulating plate, and nuts threadedly engaged with said threaded portions of the proximal end portions of said rods, respectively, so that a diameter of said filament insertion hole is reduced upon fastening of a corresponding one of said nuts, thereby fixing both the leg portions of said filament.

6. An apparatus according to claim 5, wherein said filament is a substantially U-shaped member.

7. An apparatus according to claim 1, wherein said overhang extends over the surface of said insulating plate located between a wall of said chamber neighboring to said filament support member and said base portion of said filament support member.

8. An ion source, comprising:
   an electron generating chamber;
   an ion generating chamber communicating with said electron generating chamber so as to receive electrons from said electron generating chamber, said electrons being utilized for exciting a predetermined gas to produce a plasma in said ion generating chamber, wherein said electron generating chamber comprises a chamber made of a conductive refractory material and having a discharging gas supply hole and an electron extracting hole;
   an insulating plate fixed on a side of said electron generating chamber;
   a pair of conductive filament support members inserted in said electron generating chamber through said insulating plate;
   a filament housed in said electron generating chamber, said filament having a leg portion fixed on each of said filament support members; and
   an overhang radially extending from an upper portion of at least one of said filament support members, thereby forming a shade area on the surface of said insulating plate around a base portion of said at least one filament support member, and substantially preventing a sputtered product of said filament from attaching to said shade area.

9. An apparatus according to claim 8, wherein said ion source is an electron beam excitation ion source.

10. An ion source according to claim 9, wherein said conductive filament support members comprise conductive rods, each distal end portion of said rods having an inverted conical shape to form a tapered surface, a filament insertion hole at the center of said rod, and a plurality of slits radially extending from said filament insertion hole to said tapered surface, and each proximal end portion of said rods having a threaded portion, said rods extending through said insulating plate, filament clamp portions each having the overhang at a head thereof and a tapered hole corresponding to said tapered surface of said rod, said filament clamp portions respectively receiving the each distal end portion of said rods on said insulating plate, and nuts threadedly engaged with said threaded portions of the proximal end portions of said rods, respectively, so that a diameter of said filament insertion hole is reduced upon fastening of a corresponding one of said nuts, thereby fixing each leg portion of said filament.

* * * * *